United States Patent [19]

Bagdis et al.

[11] Patent Number: 4,802,108

[45] Date of Patent: Jan. 31, 1989

[54] CIRCUIT FOR PROVIDING A SELECT RANK-ORDER NUMBER FROM A PLURALITY OF NUMBERS

[75] Inventors: Carol Bagdis, Natick; Glenn D. House, Bellingham; Wanda T. Reiss, Lexington, all of Mass.

[73] Assignee: Polaroid Corporation, Cambridge, Mass.

[21] Appl. No.: 61,717

[22] Filed: Jun. 15, 1987

[51] Int. Cl.$^4$ .............................................. G06F 7/02
[52] U.S. Cl. .............................................. 364/715.01
[58] Field of Search ............................... 364/715, 724

[56] References Cited

U.S. PATENT DOCUMENTS

| | | | |
|---|---|---|---|
| 4,135,248 | 1/1979 | Bluzer | 364/575 |
| 4,513,440 | 4/1985 | Delman | 364/715 X |
| 4,713,786 | 12/1987 | Roskind | 364/715 |

OTHER PUBLICATIONS

"Design and Implementation of a Single Chip 1-D Median Filter", Oflazer, IEEE Trans. Acoust., Speech, Signal Processing, vol. ASSP-31, No. 5, Oct. 1983, pp. 1164–1168.

"Getting the Median Faster", Computer Graphics and Image Processing, vol. 17, pp. 71–78, (1981), by Danielsson.

"A Fast Two-Dimensional Median Filtering Algorithm", Huang et al., IEEE Trans. Acoust. Speech, Signal Processing, vol. ASSP-27, No. 1, Feb. 1979, pp. 13–18.

"A New Algorithm for Real-Time Median Filtering", Bapesawara Rao et al., IEEE Trans. Acoust., Speech, Signal Processing, vol. ASSP-34, No. 6, Dec. 1986, pp. 1674–1675.

"Applications of a Nonlinear Smoothing Algorithm to Speech Processing", Rabiner, IEEE Trans. Acoust., Speech, Signal Processing, vol. ASSP-23, pp. 552–557, Dec. 1975.

Primary Examiner—Gary V. Harkcom
Assistant Examiner—Tan V. Mai
Attorney, Agent, or Firm—Edward S. Roman

[57] ABSTRACT

A method and apparatus for performing bit operations on a plurality of sample value numbers arranged in binary format to derive a select rank-order number. The bit operations are performed first on all the most significant bits of the sample value numbers to derive the most significant bit of the rank-order number. All bits of like significance of the sample value numbers are grouped and each succeeding group of less significant bits is sequentially processed to derive the corresponding bits of the rank-order number with the least significant bit of the rank-order number being lastly derived.

9 Claims, 6 Drawing Sheets

| SAMPLE NO. | DECIMAL VALUE | BINARY |
|---|---|---|
| 1 | 1 | 0 0 0 1 |
| 2 | 5 | 0 1 0 1 |
| 3 | 2 | 0 0 1 0 |
| 4 | 9 | 1 0 0 1 |
| 5 | 6 | 0 1 1 0 |

FIG 2

| INPUTS | | | | OUTPUTS | | |
|---|---|---|---|---|---|---|
| $Z_{in}$ | $O_{in}$ | D | $A_{out}$ | $A_{in}$ | $Z_{out}$ | $O_{out}$ |
| 1 | 0 | X | X | 0 | 1 | 0 |
| 0 | 1 | X | X | 1 | 0 | 1 |
| 0 | 0 | 1 | 1 | 1 | 0 | 0 |
| 0 | 0 | 1 | 0 | 1 | 0 | 1 |
| 0 | 0 | 0 | 1 | 0 | 1 | 0 |
| 0 | 0 | 0 | 0 | 0 | 0 | 0 |
| NOT USED → 1 | 1 | X | X | X | X | X |

FIG 9

|  | COL. NO. (x) = | 1 | 2 | 3 | 4 |
|---|---|---|---|---|---|
| SAMPLE NO. | 1 | 0 | 0 | 0 | 1 |
|  | 2 | 0 | 1 | 0 | 1 |
|  | 3 | 0 | 0 | 1 | 0 |
|  | 4 | 1 | 0 | 0 | 1 |
|  | 5 | 0 | 1 | 1 | 0 |

} 120

MEDIAN VALUE: 0

OUTPUT BITS: $B_1$

FIG 3

|  | COL. NO. (x) = | 1 | 2 | 3 | 4 |
|---|---|---|---|---|---|
| SAMPLE NO. | 1 | 0 | 0 | 0 | 1 |
|  | 2 | 0 | 1 | 0 | 1 |
|  | 3 | 0 | 0 | 1 | 0 |
|  | 4 | 1 | 1 | 1 | 1 |
|  | 5 | 0 | 1 | 1 | 0 |

} 122

MEDIAN VALUE: 0 1

OUTPUT BITS: $B_1$ $B_2$

FIG 4

|  | COL. NO. (x) = | 1 | 2 | 3 | 4 |
|---|---|---|---|---|---|
| SAMPLE NO. | 1 | 0 | 0 | 0 | 0 |
|  | 2 | 0 | 1 | 0 | 1 |
|  | 3 | 0 | 0 | 0 | 0 |
|  | 4 | 1 | 1 | 1 | 1 |
|  | 5 | 0 | 1 | 1 | 0 |

} 124

MEDIAN VALUE: 0 1 0

OUTPUT BITS: $B_1$ $B_2$ $B_3$

FIG 5

|  | COL. NO. (x) = | 1 | 2 | 3 | 4 |
|---|---|---|---|---|---|
| SAMPLE NO. | 1 | 0 | 0 | 0 | 0 |
|  | 2 | 0 | 1 | 0 | 1 |
|  | 3 | 0 | 0 | 0 | 0 |
|  | 4 | 1 | 1 | 1 | 1 |
|  | 5 | 0 | 1 | 1 | 1 |

} 125

MEDIAN VALUE: 0 1 0 1

OUTPUT BITS: $B_1$ $B_2$ $B_3$ $B_4$

FIG 6

CIRCUIT FOR PROVIDING A SELECT RANK-ORDER NUMBER FROM A PLURALITY OF NUMBERS

BACKGROUND OF THE INVENTION

1. Field of the Invention

This invention relates to signal processing, in general, and to image and/or speech processing, in particular. More specifically, the invention relates to a non-linear filter and method usable for rank-order filtering and, with an appropriate choice of rank, for median filtering.

2. Description of the Prior Art

Rank-order filtering is widely used in speech and image processing. It is a technique for performing non-linear smoothing of a single- or multi-dimensional signal consisting of discrete samples. An output sample is generated by the filter for each such input sample. Each input sample and some preselected number of neighboring samples are collected in a sliding window. The output value is the $n^{th}$ lowest sample value within the window, where n is the rank order of the filter. When n is the median sample (i.e., there are just as many samples in the window having greater value than the median sample as there are samples in the window of lower value), the rank-order filter is referred to as a median filter. The resulting output sequence for filtered samples tends to follow polynomial trends in the input sample sequence, while filtering out sharp discontinuities of short duration. That is, this type of filtering is particularly useful for reducing the effect of highly transient noise "spikes" in the signal being processed.

Numerous designs exist or have been proposed in the prior art for both one-dimensional and two-dimensional rank-order filters, especially median filters. Such filtering has generally proven to consume significant processing time, making implementation more difficult.

The literature contains analyses of various architectures for rank-order filtering, with particular emphasis on the complexity and speed of processing, including the type and number of operations which must be performed and the number of clock cycles required. Attention has previously been directed to the fact that VLSI technology offers system designers a high potential for performing parallel operations, which potential may be exploited for median filters. However, prior efforts in this direction leave room for much improvement.

Oflazer discusses a single chip one-dimensional median filter using an odd/even transposition sort as the high level algorithm and systolic data flow concepts at the bit level to achieve high throughput. K. Oflazer, "Design and Implementation of a Single Chip 1-D Median Filter," *I.E.E.E. Trans. on Acoustics, Speech and Sig. Proc.*, Vol. ASSP-31, No. 5, October 1983, pp. 1165–1168. He notes that the network implementing the pipelined odd/even transposition sort requires chip area proportional to the square of the window size, thus his design is suitable for median filters with small window sizes only.

Huang et al. have described a two-dimensional median filter structure and algorithm and an associated method which are based on storing the grey level histogram of the MN picture elements in a window of M×N numbers, and updating the histogram as the window moves. T. S. Huang et al., "Fast Two-Dimensional Median Filtering Algorithm," *I.E.E.E. Trans. on Acoustics, Speech on Sig. Proc.*, Vol. ASSP-27, No. 1, February 1979, pp. 13–18. According to Huang et al., the histogram needs only to be partially updated when the window is moved. By observing how many picture elements fall above and below the previous median value, that prior median can be simply adjusted each time the window is moved, to the correct new median value, by stepping upward or downward in the histogram. The algorithm requires a fast RAM for the histogram; but the time for the stepping procedure is data dependent. Consequently, one must allow for a worst case number of steps equal to the number of "buckets" in the histogram. This algorithm requires approximately 2N+10 comparisons to obtain the median of each MN set of samples.

Danielsson has suggested that the median, or any other rank-order value, can be found by collecting a set of histograms. P. Danielsson, "Getting the Median Faster," *Computer Graphics and Image Processing*, Vol. 17, pp. 71–78 (1981). This method, however, results in a rather cumbersome histogram collection process. In Danielsson's paper, he observes that Kruse has suggested that instead of arranging for histograms, one should use the arguments repeatedly, comparing them to a successively refined median. Unfortunately, as Danielsson observed, this requires fetching each argument "k" times, where k is the number of Danielsson-type histograms and the number of bits per sample.

The present invention has as its principal objective the provision of an improved architecture and method for rank-order filtering.

Further an object of the invention is to provide an improved method and apparatus for median filtering.

Yet another object of the invention is to provide a rank-order filtering architecture which is efficient and facilitates integrated circuit implementation using a silicon compiler.

Still another object of the invention is to provide such an architecture which exhibits a linear relationship between window size (i.e., the number of samples in the window as well as the number of bits in each sample) and required chip area.

SUMMARY OF THE INVENTION

The invention relates to a method and apparatus for finding a selected rank-order number from a plurality of sample value numbers in binary format. The number of most significant binary 1 or 0 digits in the sample value numbers is first counted, and the most significant binary bit for the select rank-order number is selected as a function of whether the number of most significant binary 1 or binary 0 digits so counted meets a predetermined threshold value. All the succeeding binary bits of less significance for each of the sample value numbers is then set to the same value as the most significant bit of that sample value number in which the most significant binary bit is different from the binary bit previously selected. The number of next most significant binary 1 or binary 0 digits in the sample value numbers is then counted, and the next most significant binary bit for the select rank order number is selected as a function of whether the number of next most significant binary 1 or binary 0 digits so counted meets the predetermined threshold value. All the succeeding binary bits of less significance for each of the sample value numbers is then set to the same value as the next most significant binary bit of that sample value number in which the next most significant binary bit is different from the binary bit previously selected for the next most significant binary bit of the select rank-order number. The method is continued by advancing in the aforementioned manner to successively less significant binary bits in the sample value numbers until the least significant binary bits of the sample value numbers have been processed.

The threshold value is determined by subtracting the rank-order number from the number of sample value numbers when counting binary 's. Conversely, if binary 0's are counted, the threshold value equals the rank-order number. Circuitry for implementing the method of this invention comprises at least a first select group of logic circuits corresponding to the number of sample value numbers. The circuit further includes at least one summation circuit for the group of logic circuits and one threshold circuit for the summation circuit. The threshold circuits provide both output signals that define the rank-order number and control signals to the logic circuits. A plurality of flip-flop circuits, one of each bit of the sample value numbers operate as shift registers to present groups of like significance binary bits from the sample value numbers to input the logic circuits.

DESCRIPTION OF THE DRAWINGS

The novel features that are considered characteristic of the invention are set forth with particularity in the appended claims. The invention itself, however, both as to its organization and its method of operation, together with other objects and advantages thereof will be best understood from the following description of the illustrated embodiment when read in connection with the accompanying drawings:

FIG. 2 is a diagrammatic illustration of an exemplary array of five 4-bit samples whose median is to be determined using the method of FIG. 1;

FIGS. 3-6 collectively provide a series of illustrations depicting the sequence of generating the bits of a median value for the example of FIG. 2 using the method of FIG. 1;

FIG. 9 is a truth table for the MF logic block of FIG. 8.

DESCRIPTION OF THE PREFERRED EMBODIMENT

Figure 1:
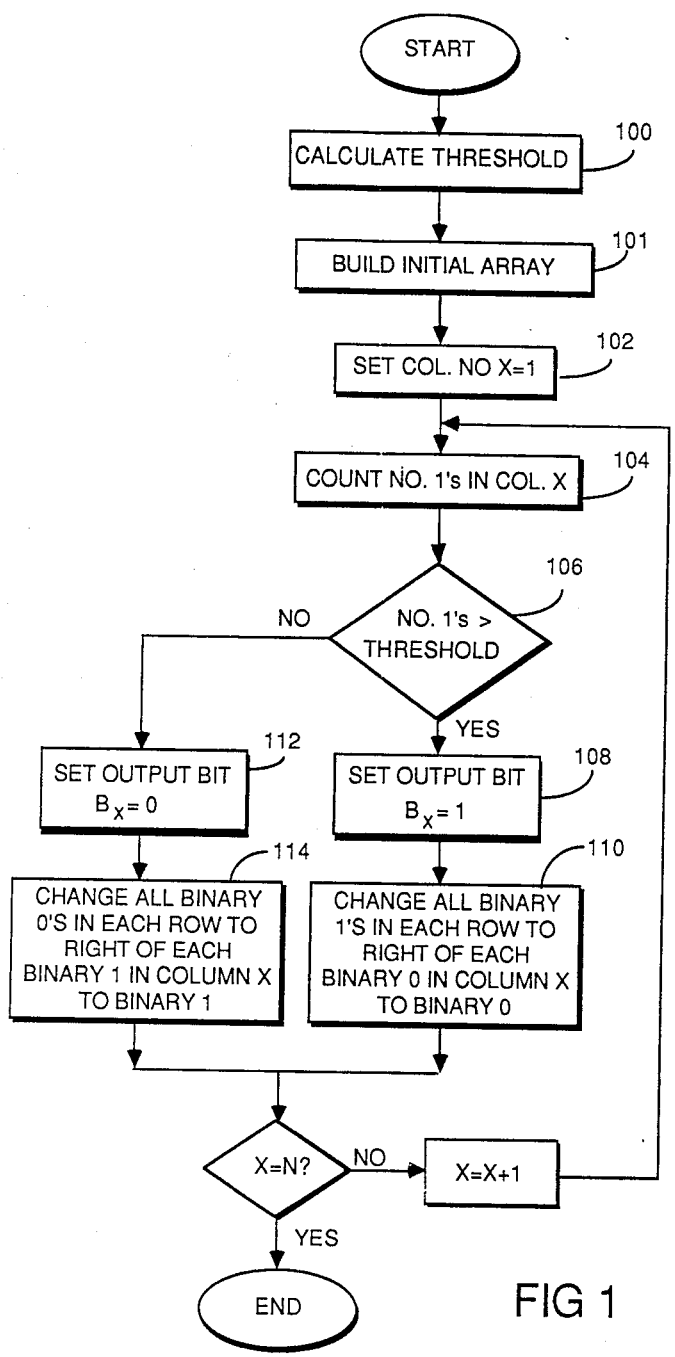
FIG. 1 is a flow chart of the method of the present invention.

By way of example, the method of the invention is illustrated in accordance with the flow chart of FIG. 1 for a rank-order filter in which the rank order is selected to be the median value.

The first step (step 100) determines the value of a threshold as a direct function of selectively rank-ordering a number of sample values in a select window of sample values. For this example, binary 1's are to be counted, so the threshold value is determined by subtracting the rank-order number from the number of sample values. Conversely, if binary 0's were to be counted, then the threshold value would equal the rank-order number. For the median filter where the number of sample values is even, either the smaller or the larger of the two middle sample values in the window may be selected to be considered as the median rank-order number.

After determining the value of the threshold for the median filter in the aforementioned manner, the binary representations of the sample values in the window are arranged in a two-dimensional array (step 101) such that each row represents one of the sample values and the respective bits of the sample values are aligned vertically in columns. FIG. 2 shows such an arrangement for an exemplary case of five 4-bit samples having the decimal values 1, 5, 2, 9 and 6, respectively. The various columns of the array as best shown in FIG. 3 are numbered 1-4, from the most significant bit (MSB) to the least significant bit (LSB) and an index "x" is used to represent the column number.

The procedure illustrated in FIG. 1, in flow chart form, then continues to determine the median value. Starting with column number 1 (step 102; x=1) which is the column containing the most-significant bits, the number of binary 1's in the column is counted (step 104). The count of binary 1's in the column is then tested against the previously determined threshold value (step 106). If the count of binary 1's is greater than the threshold value, then the most significant bit in the output word (designated $B_x 1$ or, for short, $B_1$) is then assigned the value binary 1 (step 108) and the binary 1 bits in each row to the right of each binary 0 in the first column (step 110) are changed to binary 0. If, however, the number of binary 1's in the first column is less than or equal to the threshold value, control branches from step 106 to step 112, where the output bit $B_1$ is set to binary 0 (step 112); and the binary 0 bits in each row to the right of each binary 1 in the first column (step 114) are changed to binary 1.

From either step 110 or step 114, assuming all columns have not been processed, the column number is incremented by 1 and control branches back to step 104, at which point the process is repeated for the bit position of next lesser significance. When all the columns are processed, the output rank-order number is complete and the window can be moved by a select number of sample values to re-start the procedure and generate a succeeding filtered output value. The use of the threshold value will thus be seen to be a convenient way to decide whether the sample values have more binary 0's or more binary 1's in any selected bit position, making possible a search to home in on the ranked sample value bit-by-bit. Although the determination of the threshold value is discussed by way of example in regard to the median filter, it will be readily understood that the threshold value may be selected to correspond with any selected rank ordering for a filter and is by no means limited to the median filter.

Using the example of FIG. 2, the procedure of FIG. 1 is now discussed in substantial step-by-step detail for a median filter as best shown in FIGS. 3-6. The initial status of the array is shown at 120 in FIG. 3. In this example, the threshold value is determined to be 2 in the manner as previously described, i.e., number of sample values (5)—median rank-order number (3)=2. The number of binary 1's in the first (i.e., left-most, and most-significant bit) column is determined to be less than the threshold value of 2, so that the first bit of the median value is binary 0 (as indicated below the dashed line). In accordance with step 114 all bit values in the fourth row of the array to the right of column 1 are set to binary 1's due to the presence of the binary 1 in the first column, fourth row position. The array is thus modified as shown at 122 in FIG. 4. Next, proceeding to the second column, it can be seen that there are three binary 1's, which is greater than the threshold value of 2. Accordingly, the second-most-significant bit of the median value is set to binary 1 and those binary 1's in each row to the right of the binary 0's of the second column are set to binary 0's to yield the array 124 of FIG. 5.

Proceeding to the third (i.e., next-less-significant) column, there can be seen from the array 124 of FIG. 5 to be only two binary 1's, which is less than or equal to the threshold value of 2. Therefore, the third bit of the median value is set to binary 0, as shown in FIG. 5. Further, the binary 0's in all the rows (i.e., rows 4 and 5) to the right of the binary 1's in the third column are set to binary 1 changing only a single bit in row 5 since the other bit in row 4 is already a binary 1. The resulting array is shown in FIG. 6 at 125.

The fourth bit of the median value is found from the fourth column of the array 126 to be binary 1 since this column now has three binary 1's, which is greater than the threshold value of 2; accordingly, the fourth bit of the median value is a binary 1, as shown in FIG. 6.

The value of the median number is thus the binary number 0101, equivalent to the decimal number 5, which is the median value of the five samples in the window.

The foregoing method results from the fact that once bits in a row have been set to either binary 0's or 1's, those bits are permanently set and their setting cannot subsequently change. For instance, consider the case where a row is set to binary 1's beginning at the $r^{th}$ column. Then for any column whose column number is larger than r (i.e., is in a less significant bit position), if there are more binary 0's than binary 1's in the column, rows adjacent each binary 1 in the column are set to binary 1; and if the rows have already been set to binary 1, they remain at that value. If there are more binary 1's than binary 0's in the column, then rows adjacent each binary 1 in the column are not changed. Conversely, consider the situation where a row is set to binary 0's beginning at the $r^{th}$ column. Then for any column whose column number is larger than r (i.e., is in a less significant bit position), if there are more binary 1's than binary 0's in the column, rows adjacent each binary 0 in the column are set to binary 0; and if the rows have already been set to binary 0, they remain at that value. If there are more binary 0's than binary 1's in the column, then rows adjacent each binary 0 in the column are not chanced.

From the foregoing description, it should be apparent that the procedure of the present invention does not require any memory of any prior column (i.e., a column with lower column number and more significant bit position); neither is any running sum required to be maintained. All operations occur on a bit-sliced basis and the setting (to binary 0 or binary 1) of bits in columns of lesser significant bit position occurs within a single clock cycle. In contrast with most prior art approaches, the logic is very simple. Further, no additional logic is required to handle any special cases, which is generally not the situation for the aforementioned prior art approaches.

Hardware implementation of the method of this invention requires only a few standard building blocks uniformly interconnected. A bit-slice architecture is preferably used, making the circuit extendible to virtually any size. The size of the circuit and its corresponding integrated circuit chip can be, at worst, scaled linearly in accordance with the number of sample values in the window and the size of each sample value. The use of a few standard building blocks, or "cells", also facilitates integrated circuit design.

Figure 7:
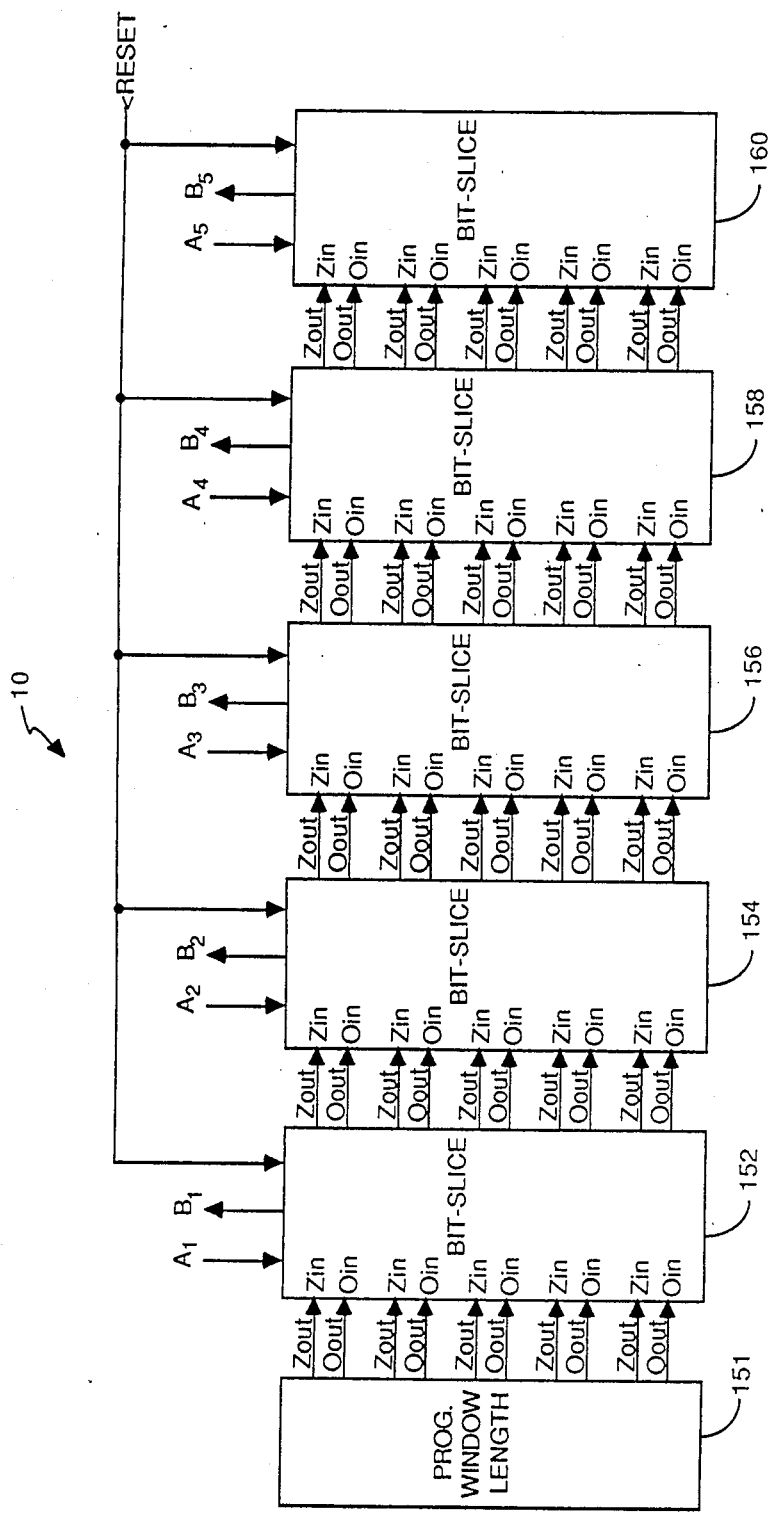
FIG. 7 is a block diagram illustrating the architecture for an exemplary apparatus for practicing the method of FIG. 1 when applied to five sample values of five bits each.

Referring now to FIG. 7, there is shown a block diagram of a circuit 10 for implementing the process of the present invention comprising a programmable window length determining circuit 151 and five bit-slice circuits 152-160 connected in serial relation with respect to each other. The window length determining circuit 151 is programmed in a manner to be subsequently described to define a sample window containing five sample values of five bits each although it will be readily understood that the circuit 10 could be programmed to accommodate less multiples of samples. All the bit-slice stages 152-160 are identical; and, therefore, it is necessary to describe in detail the operation of only one such stage 152 which is shown in greater detail in FIG. 8.

Figure 8:
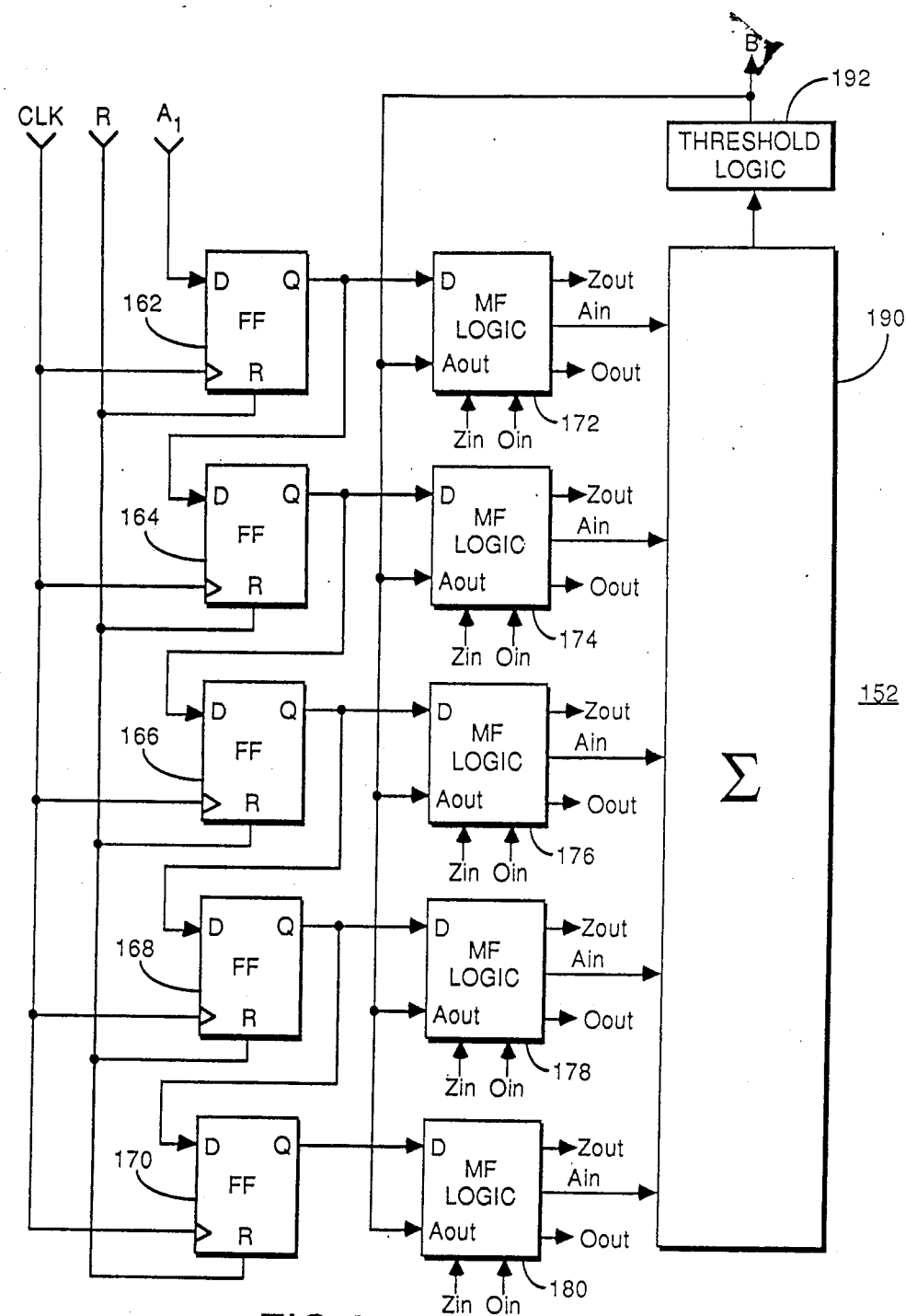
FIG. 8 is a block diagram showing in greater detail a single bit-slice stage of FIG. 7.

Referring to FIG. 8, it can be seen that the bit-slice stage 152 comprises a string of serially connected D flip-flops 162-170 which collectively operate as a shift register for receiving a bit of selected significance (which for the bit-slice circuit 152 shown is the most significant bit) from each of the sample values. Each of the flip-flops 162-172 provides an output signal at Q which is determined by the input signal provided to the input D one clock pulse earlier. Thus, for example, if a binary 1 appears at the input D to one of the flip-flops 162-170, the output Q will become a binary 1 after the next clock pulse. For the bit-slice stage 152, it will be appreciated the flip-flops 162-172 are clocked to operate collectively as a serial shift register. Thus, each of the five flip-flops ultimately outputs the most significant bit of a different one of the five sample values.

Referring now to FIG. 9, there is shown a tabulation for the binary input and output signals from a plurality of MF logic circuits 172-180. The bit-slice circuit 152 illustrated in FIG. 8 receives the most significant bits from the sample values, and the Zin, Oin input signals to the MF logic circuits 172-180 are received from the programmable window length circuit 151 which operates to set all of the $Z_{in}$, $O_{in}$ input signals to binary 0's. With the $Z_{in}$, $O_{in}$ control signals to the MF logic circuits 172-180 set in this manner, the MF logic circuits operate to transmit the D inputs without change to the corresponding $A_{in}$ lines which, in turn, connect to a summer circuit 190. Thus, the most significant bits of the five sample values are transmitted without change by way of respective flip-flops 162-170 and MF logic circuits 172-180 to the summer circuit 190. The summer circuit 190, in turn, operates to add up the output bits from all the MF logic circuits in the bit-slice stage 152 to provide a count of the number of binary 1's in the most significant bit column from the array of sample values. The output count is then directed to a threshold logic circuit 192 which operates to compare the previously counted number of binary 1's to the select threshold value. In the case of the median filter, the threshold value would be determined in the manner as previously described; and in the case of any other rank-order filter, the threshold value would be determined in correspondence with the selected rank order.

The threshold logic circuit 192, in turn, provides an output binary 1 if the number of binary 1's counted by the summer 190 exceeds the determined threshold value. The binary 1 is then outputted from the threshold logic circuit 192 to provide the most significant bit, binary 1, of the median number at output terminal B, and to simultaneously set the $A_{out}$ terminal of each MF logic circuit 172-180 to binary 1. Referring now to the truth table of FIG. 9, it can be seen that for those MF logic circuits where D and $A_{out}$ are both binary 1's, $Z_{out}$ and $O_{out}$ both will be binary 0's thereby enabling the corresponding MF logic circuit in the next succeeding bit-slice circuit 154 to transmit the next-most-significant bit from the sample value to Ain without change. However, for those MF logic circuits where $A_{out}$ is binary 1 and D is binary 0, $Z_{out}$ will be binary 1 and $O_{out}$ will be binary 0 thereby enabling the corresponding MF logic circuit in the next succeeding bit-slice circuit 154 to set $A_{in}$ to binary 0 regardless of the binary value of the next-most-significant bit from the sample value.

Conversely, if the number of binary 1's counted by the summer 190 does not exceed the determined threshold value, then the threshold logic circuit 192 provides an output binary 0. In this case the binary 0 is then outputted from the threshold logic circuit 192 to provide the most-significant bit, binary 0, of the median number at output terminal B, and to simultaneously set the $A_{out}$ terminal of each MF logic circuit 172-180 to binary 0. Referring again to the truth table of FIG. 9, it can be seen that for those MF logic circuits where $A_{in}$ and D are both binary 0's, $Z_{out}$ and $O_{out}$ both will be binary 0's thereby enabling the corresponding MF logic circuit in the next succeeding bit-slice circuit 154 to transmit the next-most-significant bit from the sample value to $A_{in}$ without change. However, for those MF logic circuits where $A_{out}$ is binary 0 and D is binary 1, $Z_{out}$ will be binary 0 and $O_{out}$ will be binary 1 thereby enabling the corresponding MF logic circuit in the next succeeding bit-slice circuit 154 to set Ain to binary 1 regardless of the binary value of the next-most-significant bit from the sample value. Thus, it is apparent from the truth table of FIG. 9 that once $Z_{out}$, $O_{out}$ from an MF logic circuit has been changed in the aforementioned manner to a binary 0, 1, respectively, all succeeding binary bits of less significance for that sample value will be set to binary 1 while conversely once $Z_{out}$, $O_{out}$ from an MF logic circuit has been changed in the aforementioned manner to binary 1, 0, respectively, all succeeding binary bits of less significance for that sample value will be set to binary 0.

This characteristic of the above-described circuit 10 of this invention may also be used to enable the circuit to change the window of sample values and process sample value less than five without modifying the circuit. This may be accomplished simply by controlling the programmable window length circuit 151 to provide binary 0, 1 logic input signals to the inputs $Z_{in}$, $O_{in}$, respectively, of MF logic circuit 178 and binary 1, 0 logic input signals to the inputs $Z_{in}$, $O_{in}$, respectively, of MF logic circuit 180. Again, referring to the truth table of FIG. 9 it can be seen that all succeeding MF logic circuits (not shown) serially connected in a row with respect to the MF logic circuit 178 which as previously described has its $Z_{in}$, $O_{in}$ inputs set to binary 0, 1, respectively, will operate to provide binary 1 logic input signals to their corresponding summer circuits (not shown). Similarly, all succeeding MF logic circuits (not shown) serially connected in a row with respect to the MF logic circuit 180 which as previously described has its $Z_{in}$, $O_{in}$ inputs set to binary 1, 0, respectively, will operate to provide binary 0 logic input signals to their corresponding summer circuits (not shown). Thus, it is readily apparent that the impact of all the flip-flop and MF logic circuits (not shown) serially connected in a row with respect to flip-flop 168 and MF logic circuit 178 are offset by the impact of all the flip-flop and MF logic circuits (not shown) serially connected in a row with respect to flip-flop 170 and MF logic circuit 180 thereby limiting the circuit 10 of FIG. 7 to operate as a rank order or median filter for only three sample values effectively discarding the last two sample values. The circuit 10 of FIG. 7 can also be readily expanded to process more than the five sample values illustrated by adding the requisite flip-flops and MF logic circuits to each bit-slice circuit 152-160 and increasing the number of inputs to the summer. The number of binary bits for each sample value can also be readily increased or decreased, respectively, simply by increasing or decreasing the number of bit-slice circuits.

As should now be readily apparent, after the median value or rank order value as the case may be is provided for a particular set of sample values within a first selected window, a new set of sample values within another select window may be clocked into the bit-slice circuits 152-160 by way of their respective flip-flops in the aforementioned manner. Thus, the modular nature of the above-described circuit architecture readily lends itself to expansion or contraction.

Although the invention has been described as preferably comprising a plurality of interconnected bit-slice circuits 152-160, it will be readily apparent to those of ordinary skill in the art that only one bit-slice circuit is required and that it can be used repeatedly in the aforementioned manner to determine each bit in the rank-order number. The appropriate clocking signals must be provided as well as a latch circuit to hold the control signals after each bit in the rank-order number is determined.

Having thus described the process and a typical embodiment of the invention, various alterations, additions and improvements will readily occur and be suggested hereby to those skilled in the art. For example, the modular nature of the above-described circuit architecture readily lends itself to expansion or contraction. In addition, the rank of the selected sample within the set of samples may be changed by varying the threshold value. The size of the window of samples also may be varied, within the limitations of the circuit. That is, the set of sample values in the window may be smaller than the maximum window size for which the circuitry is designed, and unnecessary rows in the circuitry can be effectively discarded in pairs by setting one row to all binary 0's and the other row to all binary 1's.

Other embodiments of the invention including additions, subtractions, deletions and other modifications of the preferred disclosed embodiments of the invention will be obvious to those skilled in the art and are within the scope of the following claims.

What is claimed is:

1. A circuit for providing a select rank order number from a plurality of sample value numbers each having a binary format comprising a select number of bits arranged in ordered sequence from the most significant bit to the least significant bit, said circuit comprising:
   shift register means for presenting all the binary bits of all the sample value number in selected groups, each of said groups containing an ordered sequence of all the binary bits of the same significance from all the sample value numbers;

logic means responsive to a first select input control signal for transmitting all the binary bits presented from said shift register means for each of said select groups to an output, said logic means responding to a second select input control signal for providing other select binary bits at said output in place of corresponding binary bits from said select groups;

summing means for receiving the binary bits from the output of said logic means and summing all the binary bits having the same select binary digit in each of said groups including said other select binary bits provided by said logic means in place of binary bits from said select groups to provide an output signal indicative of said summation for each of said groups; and threshold means responsive to the output signal provided by said summation circuit for each of said groups for providing the binary bits of the rank order number as a function of whether the output signal from said summation circuit for each of said group exceeds a predetermined threshold value, said binary bits output by the threshold means also operating as control signals to said logic means.

2. The circuit of claim 1 including programmable means for limiting the number of sample value numbers processed by said circuit by providing said other mode of said select input control signals to said logic means such that said logic means provides said other select binary bits at its output in place of the binary bits from said select groups.

3. The circuit of claim 1 wherein: said logic means comprises at least one logic circuit for each bit in the plurality of sample value numbers, said summation means comprises at least one summation circuit for each of said selected groups containing said ordered sequence of binary bits of the same significance and said threshold means comprises at least one threshold detect circuit for each summation circuit.

4. The circuit of claim 3 wherein: said logic circuits include at least a first select number of logic circuits including one logic circuit for each of the number of sample value numbers and a second select number of logic circuits including one logic circuit for each of the number of sample value numbers, said summation circuits include at least a first summation circuit connected to receive output signals from all the logic circuits of said first select number of logic circuits and a second summation circuit connected to receive output signals from all the logic circuits of said second select number of logic circuits, and said threshold detect circuits include at least a first threshold detect circuit connected to receive output signals from said first summation circuit and a second threshold detect circuit connected to receive output signals from said second summation circuit.

5. The circuit of claim 4 wherein: each logic circuit of said first select number of logic circuits transmits the most significant bit of a respective different one of said sample value numbers to said first summation circuit, said first summation circuit thereafter sums all the most significant bits of said same select binary digit to provide an output signal indicative of said summation, said first threshold detect circuit responds to the output signal from said first summation circuit to provide an input control signal to each logic circuit in said first select number of logic circuits as a function of whether the output signal from said first summation circuit exceeds said predetermined threshold value, each logic circuit in said first select number of logic circuits responsive to the control signals received thereby thereafter provides an output control signal to a corresponding one of the logic circuits in said second select number of logic circuits, and each logic circuit of said second select number of logic circuits transmits either the next most significant bit of a respective different one of said sample value numbers or a select binary bit value to said second summation circuit as a function of the control signal received from the corresponding logic circuit of said first select number of logic circuits.

6. The circuit of claim 5 wherein the control signal to each of said logic circuits of said second select number of logic circuits effects the transmission of a binary bit value identical to the corresponding most significant binary bit value for each most significant binary bit value different than the binary bit value output from said first threshold detect circuit regardless of the corresponding second most significant bit value presented by said shift register means to said logic circuits of said second select number of logic circuits, said control signal to each of said logic circuits of said second select number of logic circuits effecting the transmission of the corresponding second most significant bit value presented by said shift register means for each most significant binary bit value identical to the binary bit value output from said first threshold detect circuit.

7. The circuit of claim 6 including programmable means for limiting the number of sample value numbers processed by said circuit, said programmable means providing control signals to at least one or more pairs of said first select number of logic circuits such that one of said pairs of said first select number of logic circuits effects the transmission of a binary 0 to said first summation circuit and the other of said pairs of said first select number of logic circuits effects the transmission of a binary 1 to said first summation circuit, said one of said pairs of said first select number of logic circuits also operating to provide a control signal to the corresponding logic circuit of said second select number of logic circuits so that said corresponding logic circuit of said second select number of logic circuits effects the transmission of a binary 0 to said second summation circuit, said other of said pairs of said first select number of logic circuits also operating to provide a control signal to the corresponding logic circuit of said second select number of logic circuits so that said corresponding logic circuit of said second select number of logic circuits effects the transmission of a binary 1 to said second summation circuit.

8. The circuit of claim 6 wherein the select rank-order number is the median number and said predetermined threshold number equals either the number of said sample value numbers minus the selected rank-order number when said select binary digit is 1 or the rank-order number when said select binary digit is 0.

9. The circuit of claim 5 wherein said shift register means comprises at least one flip-flop for each logic circuit, said flip-flops including at least a first select number of serially interconnected flip-flops corresponding to the number of logic circuits in said first select number of logic circuits, said first select number of flip-flops connecting, respectively, to said first select number of logic circuits and clocked to pass in serial fashion from one flip-flop to the next flip-flop of said first select number of serially interconnected flip-flops the succeeding most significant bits of the sample value numbers, and at least a second select number of serially interconnected flip-flops corresponding to the number of logic circuits in said second select number of logic circuits, said second select number of flip-flops connecting, respectively, to said second select number of logic circuits and clocked to pass in serial fashion from one flip-flop to the next flip-flop of said second select number of serially interconnected flip-flops the succeeding second-most-significant bits of the sample value numbers.

* * * * *